United States Patent
Lin et al.

(10) Patent No.: US 9,640,527 B2
(45) Date of Patent: May 2, 2017

(54) ELECTROSTATIC DISCHARGE PROTECTION DEVICE WITH PARASITIC BIPOLAR JUNCTION TRANSISTORS

(71) Applicant: UNITED MICROELECTRONICS CORP., Hsinchu (TW)

(72) Inventors: Ya-Ting Lin, Yunlin County (TW); Yi-Chun Chen, Pingtung County (TW); Tien-Hao Tang, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/728,053

(22) Filed: Jun. 2, 2015

(65) Prior Publication Data
US 2016/0358904 A1 Dec. 8, 2016

(51) Int. Cl.
*H01L 21/8234* (2006.01)
*H01L 23/58* (2006.01)
*H01L 27/02* (2006.01)

(52) U.S. Cl.
CPC ................ *H01L 27/0274* (2013.01)

(58) Field of Classification Search
CPC ............. H01L 27/0274; H01L 27/0251; H01L 27/0262; H01L 27/0259; H01L 29/742; H01L 29/745; H01L 29/749; H01L 29/7455
See application file for complete search history.

(56) References Cited

U.S. PATENT DOCUMENTS

| | | | |
|---|---|---|---|
| 6,258,672 B1 * | 7/2001 | Shih | H01L 27/027 438/275 |
| 6,744,107 B1 | 6/2004 | Ker et al. | |
| 7,291,870 B2 * | 11/2007 | Lai | H01L 27/0266 257/173 |
| 7,436,041 B2 * | 10/2008 | Ker | H01L 29/7436 257/339 |
| 7,518,192 B2 | 4/2009 | Yu et al. | |
| 9,444,418 B1 * | 9/2016 | Wyse | H03F 3/4508 |

OTHER PUBLICATIONS

Ming-Dou Ker et al. Self-Substrate-Triggered Technique to Enhance Turn-On Uniformity of Multi-Finger ESD Protection Devices, IEEE Journal of Solid-State Circuits, Nov. 2006, pp. 2601-2609, vol. 41, No. 11, IEEE.

* cited by examiner

*Primary Examiner* — Thomas L Dickey
*Assistant Examiner* — Damon Hillman
(74) *Attorney, Agent, or Firm* — WPAT, PC; Justin King

(57) ABSTRACT

An electrostatic discharge (ESD) protection device includes a first trigger element and a first silicon control rectifier (SCR) element. The first trigger element has a first parasitic bipolar junction transistor (BJT) formed in a substrate. The first SCR element has a second parasitic BJT formed in the substrate. The first parasitic BJT and the second parasitic BJT has a common parasitic bipolar base, and the first parasitic BJT has a trigger voltage substantially lower than that of the second parasitic BJT.

18 Claims, 9 Drawing Sheets

ELECTROSTATIC DISCHARGE PROTECTION DEVICE WITH PARASITIC BIPOLAR JUNCTION TRANSISTORS

BACKGROUND

Technical Field

The disclosure relates in generally related to a semiconductor device, and more particularly to an electrostatic discharge (ESD) protection device.

Description of the Related Art

ESD is a transient process of high energy transformation from external to internal of an integrated circuit (IC) when the IC is floated. Several hundred or even several thousand volts are transferred during ESD stress. Such high voltage transfer will break down the electronic devices of an input stage and cause circuit error. As the critical size of the IC is scaled down constantly, it is more and more important to provide a protected circuit or device to protect the electronic devices and to discharge ESD stress.

One solution to the problem of ESD, is to provide a device that is integrated into the IC for dispersing the ESD current into earth ground. For example, a gate grounded n-type metal-oxide-semiconductor (GGNMOS) with multiple fingers has been well known and can serve as an effective ESD protection device. The ESD protection provided by the GGNMOS is based on snapback mechanism. When the voltage reaches a level beyond the IC normal operation due to ESD zapping, the snapback mechanism enables the dingers of the GGNMOS to conduct a high level ESD current between its drain and source and subsequently directs the ESD current into the earth ground. As a result, the IC can be protected from being broken down by the ESD stress.

However, it has been reported that the multi-finger GGNMOS cannot be uniformly turned on under ESD stress. There are two main issues those responsible for the non-uniform turn-on problems of multi-finger GGNMOS. One is that the parasitic lateral n-p-n BJTs of center fingers usually have substrate (base) resistance greater than that of the fingers configure at the periphery under a uniform layout style, which makes the center-finger nMOS transistors be triggered on earlier. The other is the obvious snapback characteristics of the parasitic lateral n-p-n BJT inherent in the nMOS, which makes the first turned-on center fingers solely sustain the high ESD current. As a result, the conventional GGNMOS may be easily broken down, and thus permanent failure could be caused due to the uniform conduction.

Furthermore, the uniform conduction may be getting worse with the device critical size is continually scaled down. Therefore, there is a need of providing an improved ESD protection device to obviate the drawbacks encountered from the prior art.

SUMMARY

One aspect of the present invention is to provide an electrostatic discharge (ESD) protection device, wherein the ESD protection device includes a first trigger element and a first silicon control rectifier (SCR) element. The first trigger element has a first parasitic bipolar junction transistor (BJT) formed in a substrate. The first SCR element has a second parasitic BJT formed in the substrate. The first parasitic BJT and the second parasitic BJT has a common parasitic bipolar base, and the first parasitic BJT has a trigger voltage substantially lower than that of the second parasitic BJT.

In accordance with the aforementioned embodiments of the present invention, an ESD protection device including a first trigger element and a first silicon control rectifier (SCR) element is provided, wherein the first trigger element has a first parasitic BJT formed in a substrate, the first SCR element has a second parasitic BJT formed in the substrate, and the first parasitic BJT and the second parasitic BJT has a common parasitic bipolar base.

By tuning the distance between the emitter and the grounded base of the first parasitic BJT and between the emitter and the distance between the grounded base of the second parasitic BJT to make the first parasitic BJT of the first trigger element having a trigger voltage substantially lower than that of the second parasitic BJT configured in the SCR element, the first trigger element can be turn on firstly when ESD stresses occur; and the first SCR element can be subsequently triggered on by the current passing through the common parasitic bipolar base formed between the first trigger element and the first SCR element. As a result, the majority of the ESD current can be discharged to the ground GND without making the first turned-on first trigger element solely sustain the high ESD stress, and ESD tolerance and ESD robustness of the ESD protection device can be further enhanced.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION

Figure 1A:
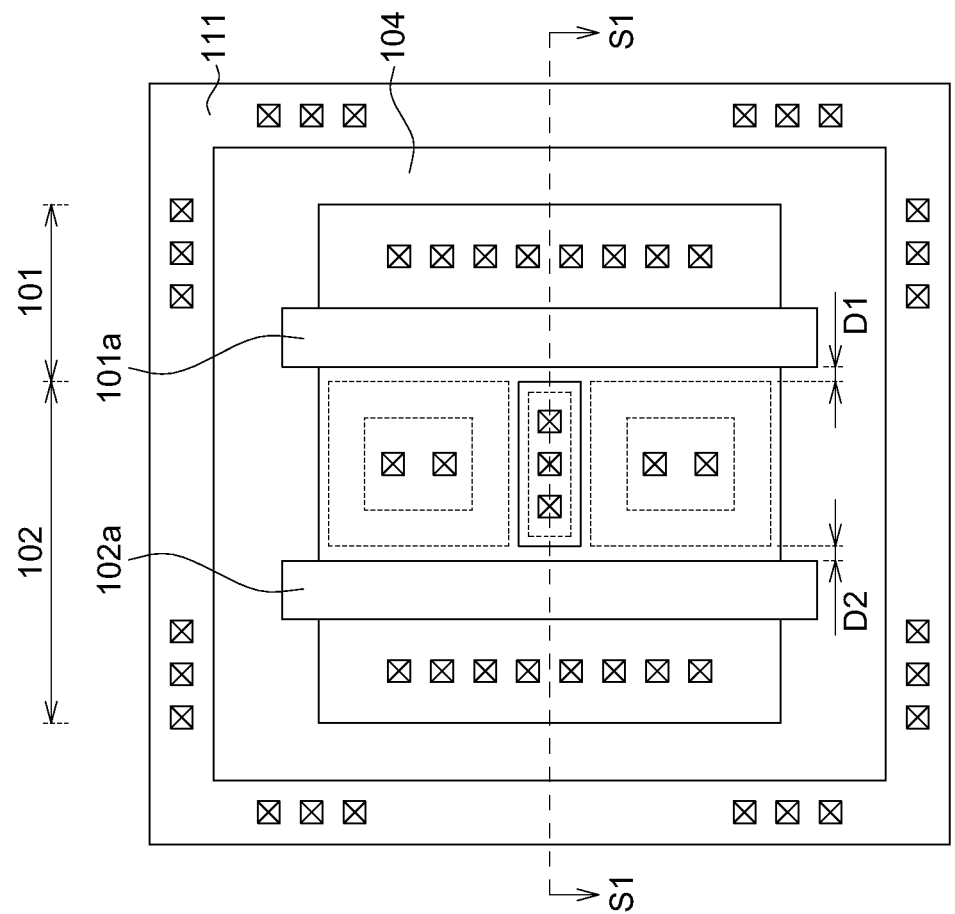
FIG. 1A is a prospective view illustrating an ESD protection device in accordance with one embodiment of the present invention.

The embodiments as illustrated below provide an ESD protection device to solve the problems of turn-on uniformity and ESD robustness under ESD stress. The present invention will now be described more specifically with reference to the following embodiments illustrating the structure and arrangements thereof.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

Figure 1B:
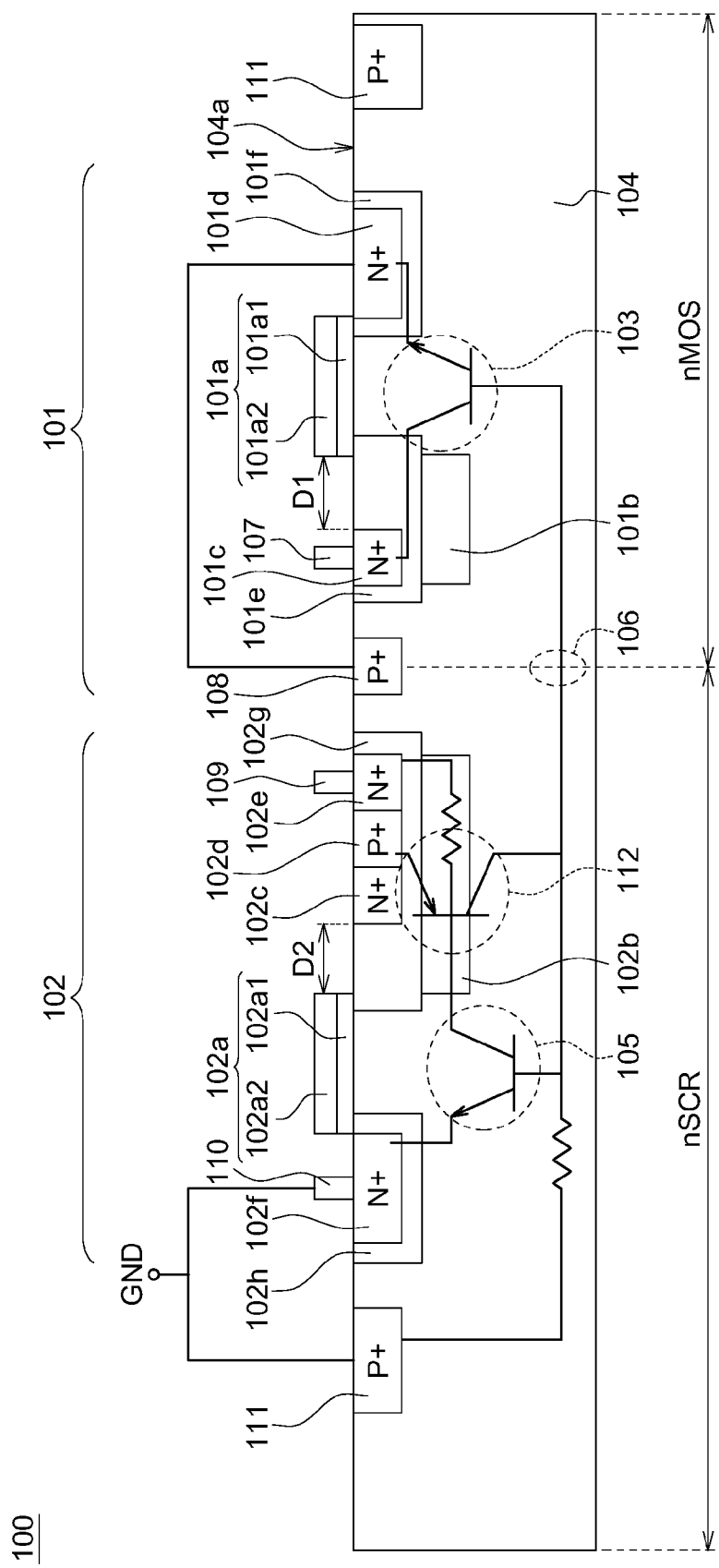
FIG. 1B is a cross-sectional view of the ESD protection device taken along the section line S1 shown in FIG. 1A.
Figure 1C:
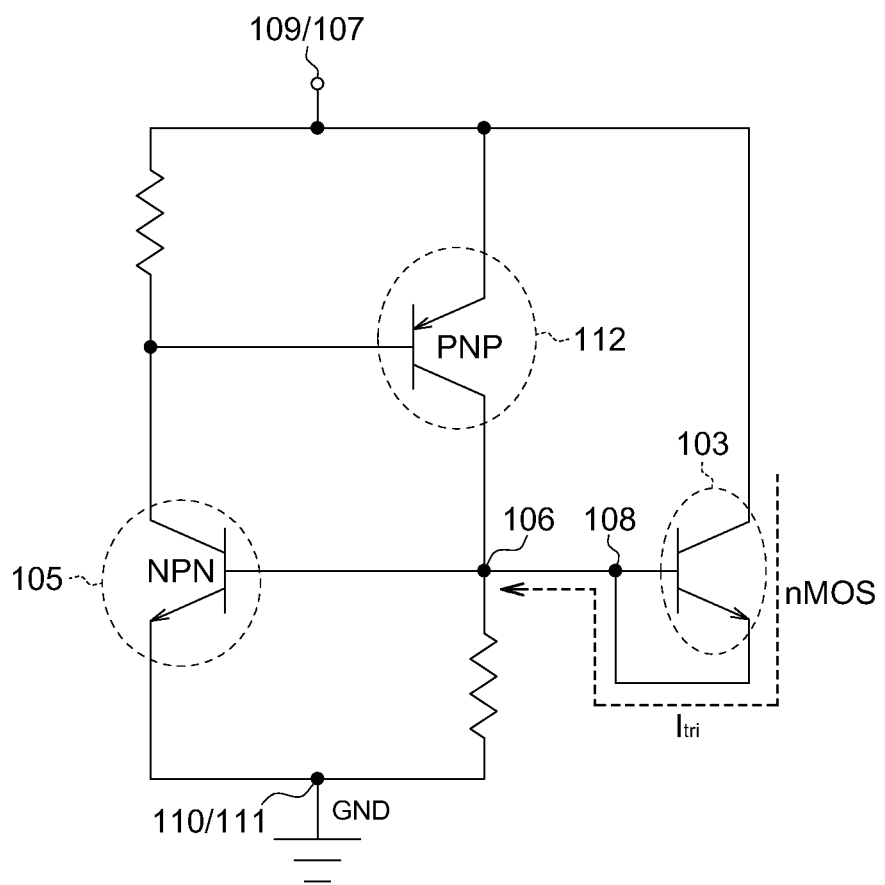
FIG. 1C is a diagram illustrating an equivalent circuit of the ESD protection device 100 according to FIGs.

FIG. 1A is a prospective view illustrating an ESD protection device 100 in accordance with one embodiment of the present invention; and FIG. 1B is a cross-sectional view of the ESD protection device 100 taken along the section line S1 shown in FIG. 1A. The ESD protection device 100 includes a first trigger element 101 and a first silicon control rectifier (SCR) element 102, wherein the first trigger element 101 has a first parasitic bipolar junction transistor (BJT) 103 formed in a substrate 104; the first SCR element 102 has a second parasitic BJT 105 formed in the substrate 104; the first parasitic BJT 103 and the second parasitic BJT 105 has a common parasitic bipolar base 106; and the first parasitic BJT 103 has a trigger voltage substantially lower than that of the second parasitic BJT 105.

For purpose of increasing the tolerance for ESD current, the first trigger element 101 of the ESD protection device 100 may be designed as a multi-finger structure and to conserve the layout space. Thus, in some embodiments of the present invention, ESD protection device 100 may be designed in a device configuration of having a plurality of finger elementary structures (as shown in FIG. 1A).

As illustrated in FIG. 1B, the first trigger element 101 includes a MOS transistor having a first gate structure 101a, a first doping well 101b, a first doping area 101c and a second doping area 101d. The first gate structure 101a includes a gate dialectic layer 101a1 disposed on the substrate 104 with a second conductivity and a gate electrode layer 101a2 disposed on the gate dialectic layer 101a1. The first doping well 101b having a first conductivity is disposed in the substrate 104 and adjacent to the first gate structure 101a. The first doping area 101c having the first conductivity is disposed in the first doping well 101b and separated from the first gate structure 101a for a first distance D1. The second doping area 101d having the first conductivity is disposed in the substrate 104 adjacent to the first gate structure 101 and separated from the first doping well 101b. In some embodiments of the present invention, the first conductivity is n-type and the second conductivity is p-type. However, in some other embodiment, the first conductivity and the second conductivity are not limited in this respect.

In detail, the first trigger element 101 can be an n-type MOS (hereinafter referred to as nMOS 101). The gate dialectic layer 101a1 may be made of silicon oxide, silicon nitrides or any other suitable dielectric material; and the gate electrode layer 101a2 may be made of poly-silicon. The first doping well 101b with n-type conductivity is disposed in the substrate 104 and adjacent to the left edge of the first gate structure 101a. The first doping area 101c with n-type conductivity is disposed in the first doping well 101b and separated from the first gate structure 101a for a first distance D1. The second doping area 101d with n-type conductivity is disposed in the substrate 104 and adjacent to the right edge of the first gate structure 101a. In addition, the second doping area 101d is separated from the first doping well 101b.

In the present embodiment, the first doping area 101c may serve as the drain of the nMOS 101 and is electrically connected to an input/output (I/O) pad (not shown) protected by the ESD protection device 100 through a node 107. The second doping area 101d may serve as the source of the nMOS 101 and is electrically connected to the substrate 104 through a p-type heavy doping area 108 (shown as P+) disposed between the nMOS 101 and the first SCR element 102. An n-p-n BJT (such as the first parasitic BJT 103) is thus formed between the first doping area 101c, the second doping area 101d and the substrate 104, wherein the first doping area 101c may serve as the emitter of the first parasitic BJT 103; the substrate 104 may serve as the base of the first parasitic BJT 103; and the second doping area 101d may serve as the collector of the first parasitic BJT 103.

In some embodiments of the present invention, the first doping area 101c (shown as N+) may have a doping concentration substantially greater than that of the first doping well 101b, and an n-type grade areas 101e may be inserted between the first doping area 101c and the first doping well 101b; and a second n-type grade areas 101f may be inserted between the substrate 104 and the second doping area 101d. The second doping area 101d (shown as N+) may have a doping concentration substantially equal that that of the first doping area 101c. However, in some other embodiment, the arrangements of the doping concentration are not limited in this respect.

The first SCR element 102 includes a second gate structure 102a, a second doping well 102b, a third doping area 102c, a fourth doping area 102d, a fifth doping area 102e and a sixth doping area 102f. Like to the first gate structure 101a, the second gate structure 102a of the first SCR element 102 also has a gate dialectic layer 102a1 disposed on the substrate 104 and a gate electrode layer 102a2 disposed on the gate electrode layer 102a2. The second doping well 102b having the first conductivity is disposed in the substrate 104 and adjacent to the second gate structure 102a. The third doping area 102c having the first conductivity is disposed in the second doping well 102b and separated from the second gate structure 102a for a second distance D2, wherein the first distance D1 is shorter than the second distance D2. The fourth doping area 102d having the second conductivity is disposed in the second doping well 102b and adjacent to one side of the third doping area 102c depart from the second gate structure 102a. The fifth doping area 102e having the first conductivity is disposed in the second doping well 102b and adjacent to the fourth doping area 102d. In addition, the fifth doping area 102e is separated from the third doping area 102c by the fourth doping area 102d. The sixth doping area 102f having the first conductivity is disposed in the substrate 104 and adjacent to the second gate structure 102a. In addition, the sixth doping area 102f is separated from the second doping well 102b.

In the present embodiment, the first SCR element 102 is an n-type parasitic SCR circuit formed in the substrate 104 with p-type conductivity. The structure of the second gate structure 102a may be identical to that of the first gate structure 101a. In some embodiments of the present invention, both of the first gate structure 101a and the second gate structure 102a can be made by the same process. The gate dialectic layer 102a1 of the second gate structure 102a is made of silicon oxide, and the gate electrode layer 102a2 is made of poly-silicon. The second doping well 102b with n-type conductivity is disposed in the substrate 104 and adjacent to the right edge of the second gate structure 102a. The third doping area 102c and the fifth doping area 102e both having n-type conductivity are formed in the second doping well 102b and separated from each other by the fourth doping well 102d with p-type conductivity that is also formed in the second doping well 102b. As shown in FIG. 1B, the fourth doping area 102d is disposed adjacent to and in contact with the right edge of the third doping area 102c that is departed from the second gate structure 102a for the second distance D2; and the right edge of the fourth doping area 102d is in contact with the left edge of the fifth doping area 102e, whereby an n-p-n doping structure is formed in the second doping well 102b. The sixth doping area 102f with n-type conductivity is disposed in the substrate 104 and adjacent to the left edge of the second gate structure 102a.

In some embodiments of the present invention, the doping concentrations of the third doping area 102c and the fifth doping area 102e (both shown as N+) may be substantially greater than that of the second doping well 102b, and an n-type grade areas 102g may be inserted between the second doping well 102b and the n-p-n doping structure configured by the third doping area 102c, the fourth doping area 102d and the fifth doping area 102e; and a second n-type grade areas 102h is inserted between the substrate 104 and the sixth doping area 102f. The sixth doping area 102f (shown as N+) may have a doping concentration substantially equal to that of the third doping area 102c and the fifth doping area 102e. However, in some other embodiment, the arrangements of the doping concentration are not limited in this respect.

FIG. 10 is a diagram illustrating an equivalent circuit of the ESD protection device 100 according to FIGS. 1A and 1B, wherein the fifth doping area 102e is electrically connected to the input/output (I/O) pad (not shown) protected by the ESD protection device 100 through a node 109; the sixth doping area 102f is grounded through a node 110; and the substrate 104 is grounded through a p-type doping area 111 extending downwards into the substrate 104 from a surface 104a of the substrate 104. As a result, the n-type parasitic SCR circuit including an n-p-n BJT (such as the second parasitic BJT 105) and a p-n-p BJT 112 is formed in the substrate 104, wherein the second parasitic BJT 105 is formed between the six doping area 102f, the substrate 104 and the fifth doping area 102e; and the p-n-p BJT 112 is formed between the substrate 104, the second doping well 102b and the fourth doping area 102d. In the present embodiment, the first parasitic BJT 103 and the second parasitic BJT 105 have a common parasitic bipolar base 106 formed in the substrates 104.

Since the first distance D1 is shorter than the second distance D2, the first parasitic BJT 103 has a trigger voltage substantially lower than that of the second parasitic BJT 105 and the p-n-p BJT 112. Such that the first trigger element 101 can be turn on firstly when ESD stresses occur on the I/O pad. In addition, because the first parasitic BJT 103 and the second parasitic BJT 105 have a common parasitic bipolar base 106 formed in the substrates 104, the first SCR element 102 can be subsequently triggered on by the current $I_{tri}$ passing through the first parasitic BJT 103 and to discharge the majority of the ESD current to the ground GND without making the first turned-on first trigger element 101 solely sustain the high ESD stress. Such that ESD tolerance of the ESD protection device 100 can be further enhanced.

In some embodiments of the present invention, the ESD protection device 100 may further include a guard ring 111 surrounding the first trigger element 101 and the first SCR element 102. In the present embodiment, the guard ring 111 is a p-type doping region (shown as P+) extending downwards into the substrate 104 from the surface 104a of the substrate 104.

However it should be appreciated that, in some other embodiments of the present invention, the conductivity type of the first trigger element 101 and the first SCR element 102 in the ESD protection device 100 may be altered, and the conductivity types of those doping wells and doping areas described therein will be correspondingly altered according to the selections in their conductivity types of the elementary MOS transistor, SCR circuit and the guard ring.

Figure 2A:
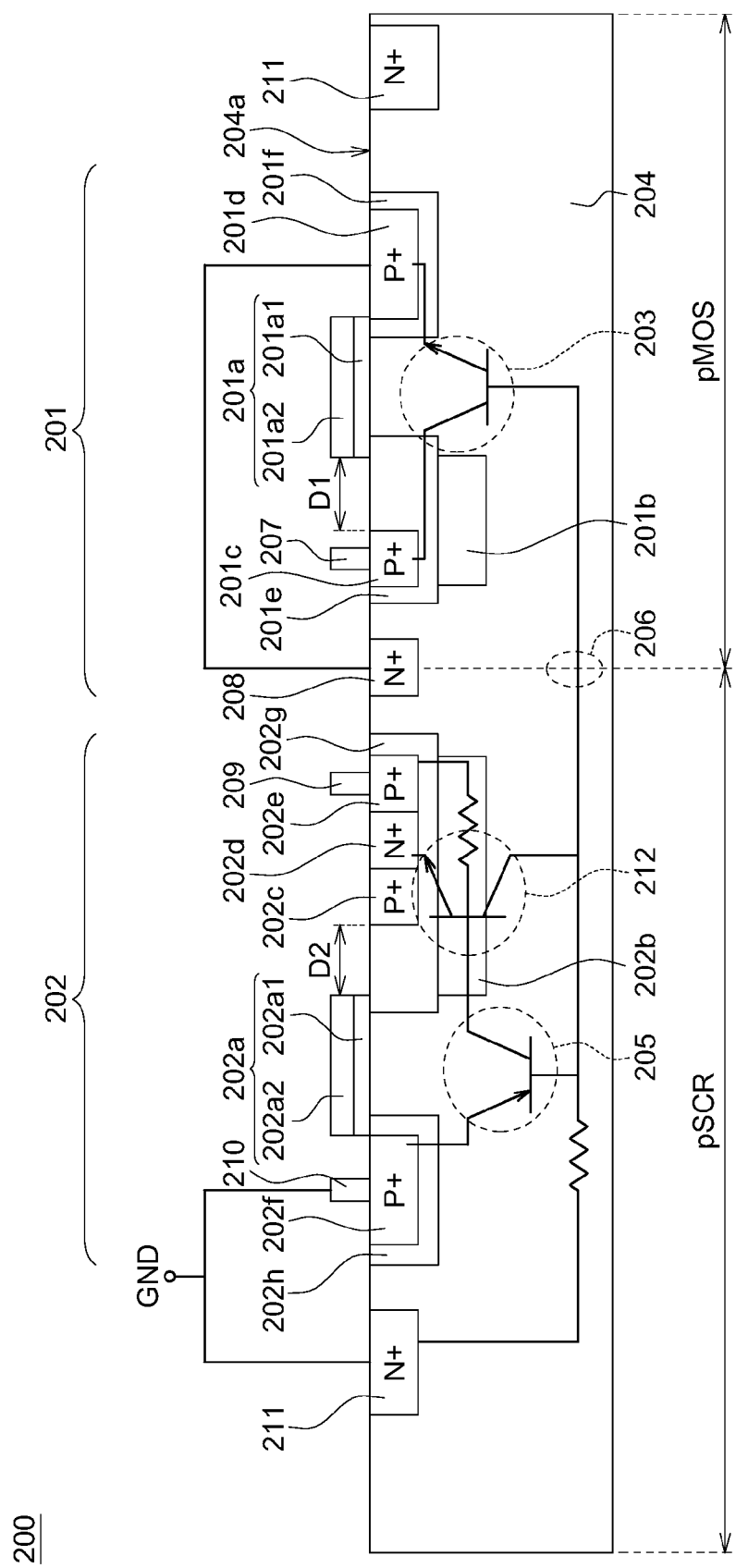
FIG. 2A is a cross-sectional view of an ESD protection device in accordance with another embodiment of the present invention.

For example, FIG. 2A is a cross-sectional view of an ESD protection device 200 in accordance with another embodiment of the present invention. The structure of the ESD protection device 200 is substantially identical to that of the ESD protection device 100 depicted in FIG. 1B, except that the conductivity types of those doping wells and doping areas described in FIG. 2A are correspondingly altered. In detail, the first trigger element 201 is a p-type MOS (hereinafter referred to as pMOS 201), and the first SCR element 202 is a p-type parasitic SCR circuit formed in the substrate 204 with n-type conductivity.

In the present embodiment, the first trigger element 201 includes a pMOS transistor having a first gate structure 201a, a first doping well 201b, a first doping area 201c and a second doping area 201d. The first gate structure 201a of the pMOS 201 is identical to the first gate structure 101a of the nMOS 101, wherein the gate dialectic layer 201a1 may be made of silicon oxide, and the gate electrode layer 201a2 may be made of poly-silicon. The first doping well 201b with p-type conductivity is disposed in the substrate 204 and adjacent to the left edge of the first gate structure 201a. The first doping area 201c with p-type conductivity is disposed in the first doping well 201b and separated from the first gate structure 201a for a first distance D1. The second doping area 201d with p-type conductivity is disposed in the substrate 204 and adjacent to the right edge of the first gate structure 201a. In addition, the second doping area 201d is separated from the first doping well 201b.

The first doping area 201c may serve as the drain of the pMOS 201 and is electrically connected to an input/output (I/O) pad (not shown) protected by the ESD protection device 200 through a node 207. The second doping area 201d may serve as the source of the pMOS 201 and is electrically connected to the substrate 204 through an n-type heavy doping area 208 (shown as N+) disposed between the pMOS 201 and the first SCR element 202. An p-n-p BJT (such as the first parasitic BJT 203) is thus formed between the first doping area 201c, the second doping area 201d and the substrate 204, wherein the first doping area 201c may serve as the emitter of the first parasitic BJT 203; the substrate 204 may serve as the base of the first parasitic BJT 203; and the second doping area 201d may serve as the collector of the first parasitic BJT 203.

In some embodiments of the present invention, the first doping area 201c (shown as P+) may have a doping concentration substantially greater than that of the first doping well 201b, and an p-type grade areas 201e may be inserted between the first doping area 201c and the first doping well 201b; and another p-type grade areas 201f may be inserted between the substrate 204 and the second doping area 201d. The second doping area 201d (shown as P+) may have a doping concentration substantially equal that that of the first doping area 201c. However, in some other embodiment, the arrangements of the doping concentration are not limited in this respect.

The first SCR element 202 with p-type conductivity includes a second gate structure 202a, a second doping well 202b, a third doping area 202c, a fourth doping area 202d, a fifth doping area 202e and a sixth doping area 202f. Like to the first gate structure 201a, the second gate structure 202a of the first SCR element 202 also has a gate dialectic layer 202a1 disposed on the substrate 204 and a gate electrode layer 202a2 disposed on the gate electrode layer 202a2. The structure of the second gate structure 202a may be identical to that of the first gate structure 201a. The second doping well 202b with p-type conductivity is disposed in the substrate 204 and adjacent to the right edge of the second gate structure 202a. The third doping area 202c and the fifth doping area 202e both having p-type conductivity are formed in the second doping well 202b and separated from each other by the fourth doping area 202d with n-type conductivity that is also formed in the second doping well 202b. As shown in FIG. 2A, the fourth doping area 202d is disposed adjacent to and in contact with the right edge of the third doping area 202c that is departed from the second gate structure 202a for the second distance D2; and the right edge of the fourth doping area 202d is in contact with the left edge of the fifth doping area 202e, whereby an p-n-p doping structure is formed in the second doping well 202b. The sixth doping area 202f with p-type conductivity is disposed in the substrate 204 and adjacent to the left edge of the second gate structure 202a.

In some embodiments of the present invention, the doping concentrations of the third doping area 202c and the fifth doping area 202e (both shown as P+) may be substantially greater than that of the second doping well 202b, and an p-type grade areas 202g may be inserted between the second doping well 202b and the p-n-p doping structure configured by the third doping area 202c, the fourth doping area 202d and the fifth doping area 202e; and a second p-type grade areas 202h is inserted between the substrate 204 and the sixth doping area 202f. The sixth doping area 202f (shown as P+) may have a doping concentration substantially equal to that of the third doping area 202c and the fifth doping area 202e. However, in some other embodiment, the arrangements of the doping concentration are not limited in this respect.

In some embodiments of the present invention, the ESD protection device 200 may further include a guard ring 211 surrounding the first trigger element 201 and the first SCR element 202. In the present embodiment, the guard ring 211 is an n-type doping region (shown as N+) extending downwards into the substrate 204 from the surface 204a of the substrate 204.

Figure 2B:
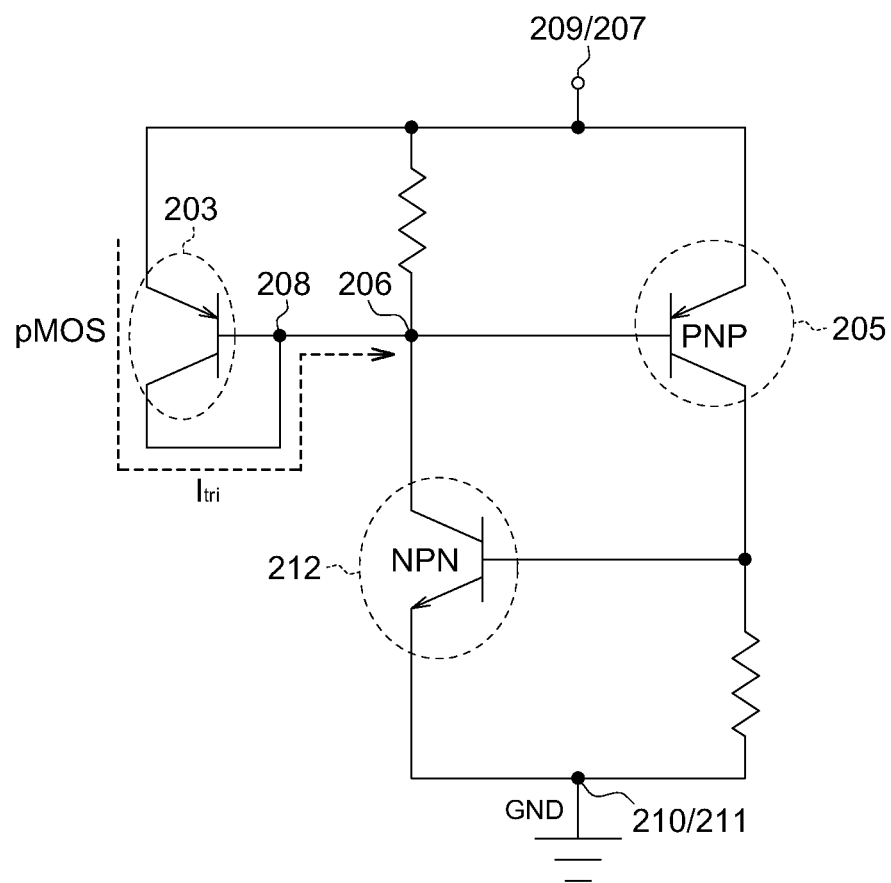
FIG. 2B is a diagram illustrating an equivalent circuit of the ESD protection device depicted in FIG. 2A.

FIG. 2B is a diagram illustrating an equivalent circuit of the ESD protection device 200 depicted in FIG. 2A, wherein the fifth doping area 202e is electrically connected to the input/output (I/O) pad (not shown) protected by the ESD protection device 200 through a node 209; the sixth doping area 202f is grounded through a node 210; and the substrate 204 is grounded through an n-type heavy doping area 211 (shown as N+) extending downwards into the substrate 204 from a surface 204a of the substrate 204. As a result, the p-type parasitic SCR circuit including an p-n-p BJT (such as the second parasitic BJT 205) and an n-p-n BJT 212 is formed in the substrate 204, wherein the second parasitic BJT 205 is formed between the sixth doping 1 area 202f, the substrate 204 and the fifth doping area 202e; and the n-p-n BJT 212 is formed between the substrate 204, the second doping well 202b and the fourth doping area 202d. In the present embodiment, the first parasitic BJT 203 and the second parasitic BJT 205 have a common parasitic bipolar base 206 formed in the substrates 204.

Since the first distance D1 is shorter than the second distance D2, thus the resistance between the emitter and the grounded base of the first parasitic BJT 203 may smaller than the resistance between the emitter and the grounded base of the second parasitic BJT 205 and the n-p-n BJT 212, the first parasitic BJT 203 has a trigger voltage substantially lower than that of the second parasitic BJT 205 and the n-p-n BJT 212. Such that the first trigger element 201 can be turn on firstly when ESD stresses occur on the I/O pad. In addition, because the first parasitic BJT 203 and the second parasitic BJT 205 have a common parasitic bipolar base 206 formed in the substrates 204, the first SCR element 202 can be subsequently triggered on by the current $I_{tri}$ passing through the first parasitic BJT 203 and to discharge the majority of the ESD current to the ground GND without making the first turned-on first trigger element 201 solely sustain the high ESD stress. Such that ESD tolerance of the ESD protection device 200 can be further enhanced.

Figure 3:
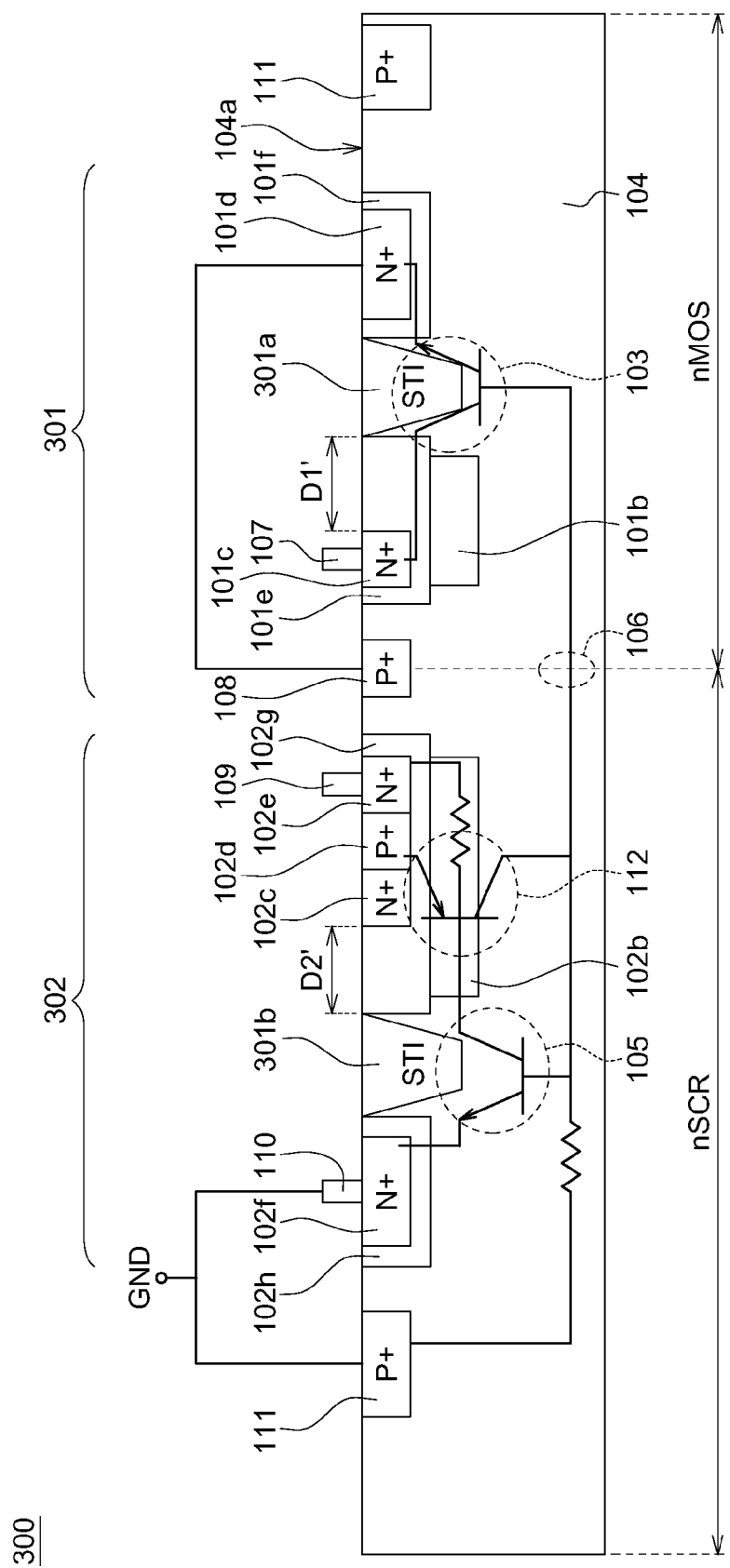
FIG. 3 is a cross-sectional view of an ESD protection device in accordance with yet another embodiment of the present invention.
Figure 4:
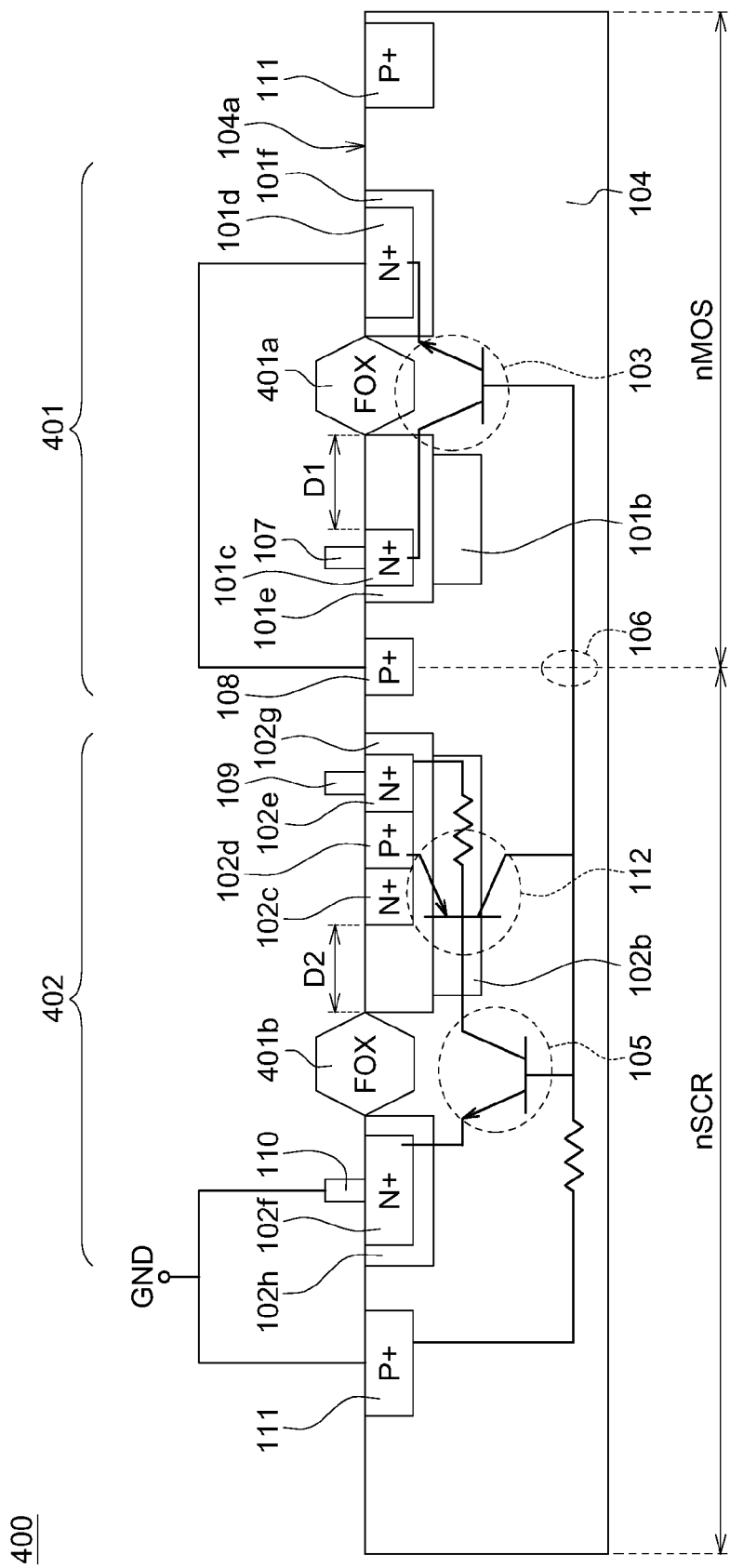
FIG. 4 is a cross-sectional view of an ESD protection device in accordance with yet another embodiment of the present invention.

In some embodiments of the present invention, the ESD protection device having a plurality of parasitic BJTs may not include any MOS transistor. For example, FIG. 3 is a cross-sectional view of an ESD protection device 300 in accordance with yet another embodiment of the present invention. The structure of the ESD protection device 300 is substantially identical to that of the ESD protection device 100 depicted in FIG. 1B, except that the first gate structure 101a of the trigger element 101 and the second gate structure 102a of the first SCR element 102 are respectively replaced by shallow trench isolations (STIs) 301a and 302a. Alternatively, the first gate structure 101a of the trigger element 101 and the second gate structure 102a of the first SCR element 102 depicted in FIG. 1B may be also replaced by filed oxide (FOXs) respectively, such as the FOX 401a and 402a, to form an ESD protection device 400 without any MOS transistor, in accordance with yet another embodiment of the present invention, see FIG. 4.

Figure 5A:
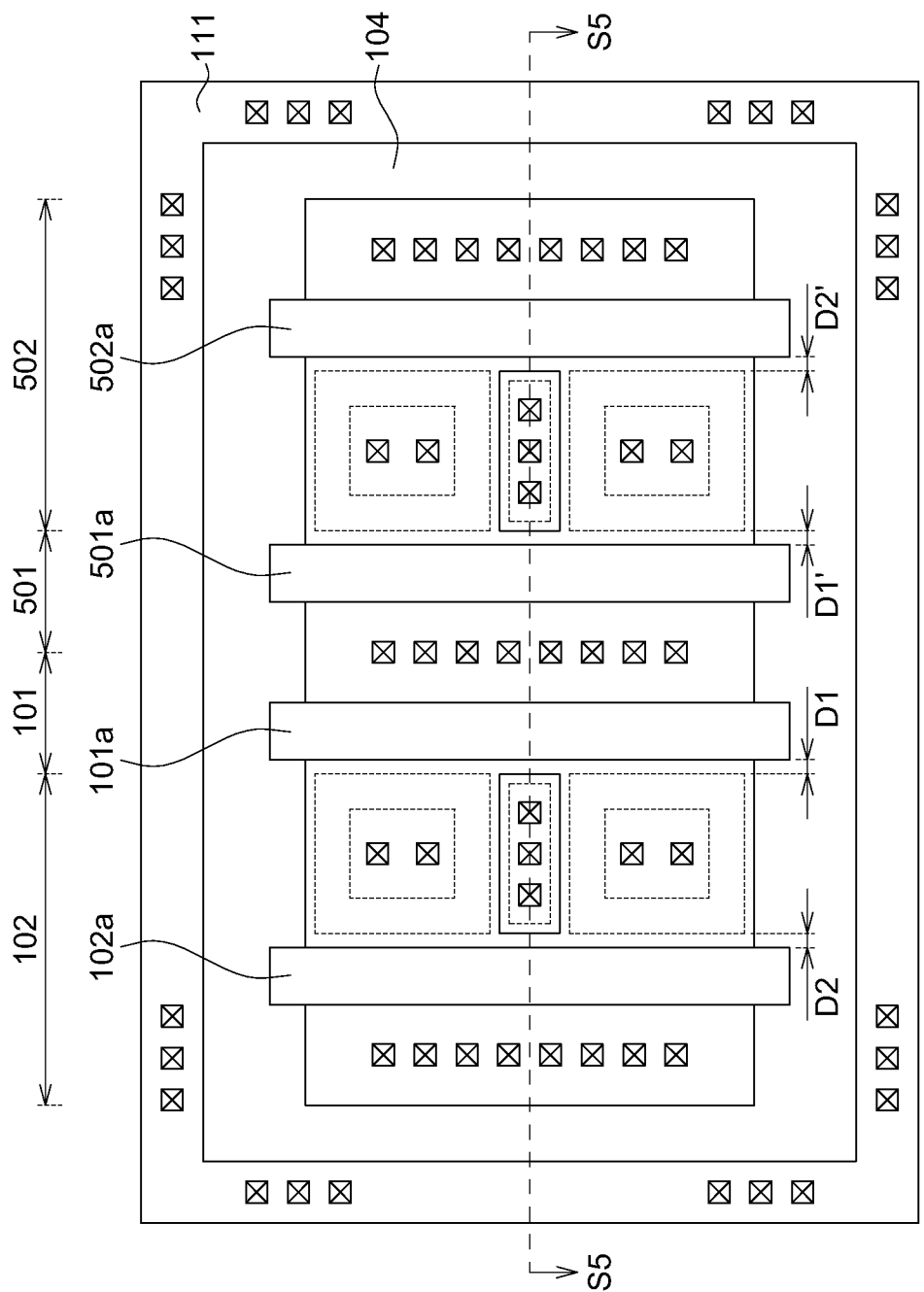
FIG. 5A is a prospective view illustrating an ESD protection device in accordance with yet another embodiment of the present invention.
Figure 5B:
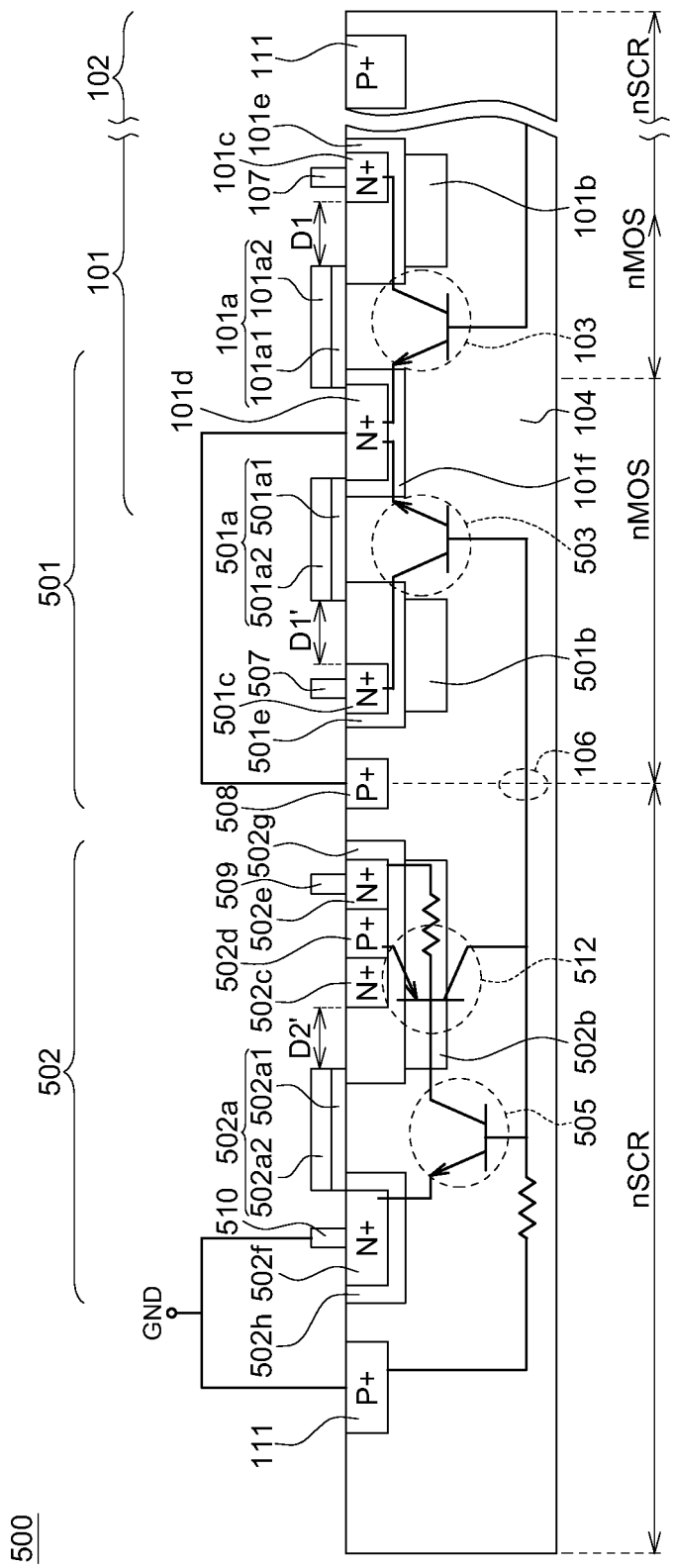
FIG. 5B is a cross-sectional view of the ESD protection device taken along the section line S5 shown in FIG. 5A.

In some embodiments of the present invention, ESD protection device may further include other trigger elements and SCR elements. FIG. 5A is a prospective view illustrating an ESD protection device 500 in accordance with yet another embodiment of the present invention; and FIG. 5B is a cross-sectional view of the ESD protection device 500 taken along the section line S5 shown in FIG. 5A. The structure of the ESD protection device 500 is substantially identical to that of the ESD protection device 100 depicted in FIG. 1B, except that the ESD protection device 500 further includes a second trigger element 501 and a second SCR element 502.

In the present embodiment, the second trigger element 501 and the second SCR element 502 is a mirror-symmetric structure of the first trigger element 101 and the first SCR element 102. In other words, the second trigger element 501 and the second SCR element 502 are parallelly disposed at the left hand side of the first SCR element 102. Since the structure and doping arrangements of the first trigger element 101 and the first SCR element 102 have been disclosed in the aforementioned embodiments, thus will not redundantly described herein.

The second trigger element 501 is an nMOS transistor having a third gate structure 501a, a third doping well 501b, a seventh doping area 501c and a eighth doping area The third gate structure 501a has a gate dialectic layer 501a1 disposed on the substrate 104 and a gate electrode layer 501a2 disposed on the gate electrode layer 501a2. The third doping well 501b with n-type conductivity is disposed in the substrate 104 and adjacent to the left edge of the third gate structure 501a. The seventh doping area 501c with n-type conductivity is disposed in the third doping well 501b and separated from third doping well 501b for a third distance D1'. The eighth doping area 101d with n-type conductivity is disposed in the substrate 104 and adjacent to the right edge of the third gate structure 501a. In addition, the eighth doping area 101d is separated from the third gate structure 501a. In the present embodiment, since the eighth doping area and the second doping area 101d of the trigger element 101 share the same doping area, thus thereinafter the eighth doping area is also referred to as eighth doping area 101d.

The seventh doping area 501c may serve as the drain of the nMOS 501 and is electrically connected to an I/O pad (not shown) protected by the ESD protection device 500 through a node 507. The eighth doping area 101d may serve as the source of the nMOS 501 and is electrically connected to the substrate 104 through an p-type doping area 508 disposed between the nMOS 501 and the second SCR element 502. An n-p-n BJT (such as the parasitic BJT 503) is thus formed between the seventh doping area 501c, the eighth doping area 101d and the substrate 104, wherein the seventh doping area 501c may serve as the collector of the parasitic BJT 503; the substrate 104 may serve as the base of the parasitic BJT 503; and the eighth doping area 101d may serve as the emitter of the first parasitic BJT 503

The second SCR element 502 is an n-type parasitic SCR circuit formed in the substrate 104 with n-type conductivity, and includes a fourth gate structure 502a, a fourth doping well 502b, a ninth doping area 502c, a tenth doping area 502d, a eleventh doping area 502e and a twelfths doping area 502f. Like to the third gate structure 501a, the fourth gate structure 502a of the second SCR element 502 also has a gate dialectic layer 502a1 disposed on the substrate 104 and a gate electrode layer 502a2 disposed on the gate electrode layer 502a2. The structure of the fourth gate structure 502a may be identical to that of the third gate structure 501a. The fourth doping well 502b with n-type conductivity is disposed in the substrate 104 and adjacent to the right edge of the fourth gate structure 502a. The ninth doping area 502c and the eleventh doping area 502e both having n-type conductivity are formed in the fourth doping well 502b and separated from each other by the tenth doping area 502d with p-type conductivity that is also formed in the fourth doping well 502b. As shown in FIG. 5B, the tenth doping area 502d is disposed adjacent to and in contact with the right edge of the ninth doping area 502c that is departed from the fourth gate structure 502a for a fourth distance D2'; and the right edge of the tenth doping area 502d is in contact with the left edge of the eleventh doping area 502e, whereby an n-p-n doping structure is formed in the fourth doping well 502b. The twelfths doping area 502f with n-type conductivity is disposed in the substrate 104 and adjacent to the left edge of the fourth gate structure 502a.

In some embodiments of the present invention, the doping concentrations of the ninth doping area 502c and the eleventh doping area 502e (both shown as N+) may be substantially greater than that of the fourth doping well 502b, and an n-type grade areas 502g may be inserted between the fourth doping well 502b and the n-p-n doping structure configured by the ninth doping area 502c, the tenth doping area 502d and the eleventh doping area 502e; and a second n-type grade areas 502h is inserted between the substrate 104 and the twelfths doping area 502f. The twelfths doping area 502f (shown as N+) may have a doping concentration substantially equal to that of the ninth doping area 502c and the eleventh doping area 502e. However, in some other embodiment, the arrangements of the doping concentration are not limited in this respect.

The eleventh doping area 502e is electrically connected to the I/O pad (not shown) protected by the ESD protection device 500 through a node 509; the twelfths doping area 502f is grounded through a node 510; and the substrate 104 is grounded through an n-type doping area 511 extending downwards into the substrate 104 from a surface 104a of the substrate 104. As a result, the n-type parasitic SCR circuit including an n-p-n BJT (such as the parasitic BJT 505) and an p-n-p BJT 512 is formed in the substrate 104, wherein the parasitic BJT 505 is formed between the twelfths doping area 502f, the substrate 104 and the eleventh doping area 502e; and the p-n-p BJT 512 is formed between the substrate 104, the fourth doping well 502b and the tenth doping area 502d. In the present embodiment, the first parasitic BJT 103, the second BJT 105, the parasitic BJT 505 and an p-n-p BJT 512 have a common parasitic bipolar base 106 formed in the substrates 104, and the first parasitic BJT 503 has a trigger voltage substantially lower than that of the parasitic BJT 505.

Since the third distance D1' is shorter than the fourth distance D2', the parasitic BJT 503 has a trigger voltage substantially lower than that of the parasitic BJT 505 and the p-n-p BJT 512. Such that the second trigger element 501 can be turn on firstly when ESD stresses occur on the I/O pad. In addition, because the parasitic BJT 503 and the parasitic BJT 505 have a common parasitic bipolar base 106 formed in the substrates 104, the second SCR element 502 can be subsequently triggered on by the current passing through the parasitic BJT 503 and to discharge the majority of the ESD current to the ground GND without making the first turned-on second trigger element 501 solely sustain the high ESD stress. Such that ESD tolerance of the ESD protection device 500 can be further enhanced.

In some embodiments of the present invention, the first trigger element 101 may be configured as a center finger, and the ESD protection device may has more than two trigger elements mirror-symmetrically arranged around the center finger used to trigger one or more SCR elements. For example, there are two mirror-symmetric second trigger elements 501 arranged around the center fingers of the first trigger element 101. Since the center finger is much easier to be triggered, for the purpose of uniformly turning on all fingers, the trigger voltage of center finger should be adjusted higher than that of the peripheral trigger elements arranged around the central finger. In the present embodiment, in order to make the central first trigger element 101 and the peripheral second trigger elements 501 turn on more uniformly, the third distances D1' of the second trigger elements 501 should be shorter than the first distance D1 of the first trigger element 101.

In some embodiments of the present invention the trigger elements and the SCR elements may be disposed on the edge portion of the ESD protection device, nevertheless the trigger elements (such as the first trigger element 101 and the second trigger element 501) and the SCR elements (such as the first SCR element 102 and the second SCR element 502) disclosed in the aforementioned embodiments are disposed on the central part of the ESD protection device 500.

In accordance with the aforementioned embodiments of the present invention, an ESD protection device including a first trigger element and a first silicon control rectifier (SCR) element is provided, wherein the first trigger element has a first parasitic BJT formed in a substrate, the first SCR element has a second parasitic BJT formed in the substrate, and the first parasitic BJT and the second parasitic BJT has a common parasitic bipolar base.

By tuning the distance between the emitter and the grounded base of the first parasitic BJT and the distance between the emitter and the grounded base of the second parasitic BJT to make the first parasitic BJT of the first trigger element having a trigger voltage substantially lower than that of the second parasitic BJT configured in the SCR element, the first trigger element can be turn on firstly when ESD stresses occur; and the first SCR element can be subsequently triggered on by the current passing through the common parasitic bipolar base formed between the first trigger element and the first SCR element. As a result, the majority of the ESD current can be discharged to the ground GND without making the first turned-on first trigger element solely sustain the high ESD stress, and ESD tolerance and ESD robustness of the ESD protection device can be further enhanced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrostatic discharge protection device, comprising:
   a first trigger element, having a first parasitic bipolar junction transistor (BJT) formed in a substrate and electrically connected to an input/output pad; and
   a first silicon control rectifier (SCR) element, having a second parasitic BJT formed in the substrate;
   wherein the first parasitic BJT and the second parasitic BJT has a common parasitic bipolar base, and the first parasitic BJT has a trigger voltage substantially lower than that of the second parasitic BJT.

2. The ESD protection device according to claim 1, wherein the first trigger element comprises a first metal-oxide-semiconductor (MOS) transistor comprising:
   a first gate structure, disposed on the substrate;
   a first doping well having a first conductivity, disposed in the substrate and adjacent to the first gate structure;
   a first doping area having the first conductivity, disposed in the first doping well and separated from the first gate structure for a first distance; and
   a second doping area having the first conductivity, disposed in the substrate, adjacent to the first gate structure and separated from the first doping well.

3. The ESD protection device according to claim 2, wherein the first parasitic BJT is formed between the first doping area, the second doping area and the substrate.

4. The ESD protection device according to claim 1, wherein the first SCR element comprises:
   a second gate structure, disposed on the substrate;
   a second doping well, having the first conductivity, disposed in the substrate and adjacent to the second gate structure;
   a third doping area, having the first conductivity, disposed in the second doping well and separated from the second gate structure for a second distance;
   a fourth doping area, having a second conductivity, disposed in the second doping well, adjacent to one side of the third doping area depart from the second gate structure;
   a fifth doping area, having the first conductivity, disposed in the second doping well, adjacent to the fourth doping area and separated from the third doping area by the fourth doping area; and
   a sixth doping area, having the first conductivity, disposed in the substrate, adjacent to the second gate structure and separated from the second doping well.

5. The ESD protection device according to claim 4, wherein the second parasitic BJT is formed between the fifth doping area, the sixth doping area and the substrate.

6. The ESD protection device according to claim 4, wherein the first distance is shorter than the second distance.

7. The ESD protection device according to claim 4, wherein the first conductivity is n type and the second conductivity is p type.

8. The ESD protection device according to claim 4, wherein the first conductivity is p type and the second conductivity is n type.

9. The ESD protection device according to claim 1, further comprising a second SCR element, having a third parasitic BJT formed in the substrate; wherein the first parasitic BJT and the third parasitic BJT has a common parasitic bipolar base, and the first parasitic BJT has a trigger voltage substantially lower than that of the third parasitic BJT.

10. The ESD protection device according to claim 9, wherein the first trigger element is disposed between the first SCR element and the second SCR element.

11. The ESD protection device according to claim 4, further comprising:
    a second trigger element, having a third parasitic BJT formed in a substrate; and
    a second SCR element, having a fourth parasitic BJT formed in the substrate;
    wherein the third parasitic BJT and the fourth parasitic BJT has a common parasitic bipolar base, and the third parasitic BJT has a trigger voltage substantially lower than that of the fourth parasitic BJT.

12. The ESD protection device according to claim 11, wherein the second trigger element comprises a second MOS transistor comprising:
    a third gate structure, disposed on the substrate;
    a third doping well having the first conductivity, disposed in the substrate and adjacent to the third gate structure;
    a seventh doping area having the first conductivity, disposed in the third doping well and separated from the third gate structure for a third distance; and
    an eighth doping area having the first conductivity, disposed in the substrate, adjacent to the third gate structure and separated from the third doping well.

13. The ESD protection device according to claim 12, wherein the third parasitic BJT is formed between the seventh doping area, the eighth doping area and the substrate.

14. The ESD protection device according to claim 12, wherein the second SCR element comprises:
    a fourth gate structure, disposed on the substrate;
    a fourth doping well, having the first conductivity, disposed in the substrate and adjacent to the fourth gate structure;
    a ninth doping area, having the first conductivity, disposed in the fourth doping well and separated from the fourth gate structure for a fourth distance;
    a tenth doping area, having a second conductivity, disposed in the fourth doping well, adjacent to one side of the ninth doping area depart from the fourth gate structure;
    an eleventh doping area, having the first conductivity, disposed in the fourth doping well, adjacent to the tenth doping area and separated from the ninth doping area by the tenth doping area;
    a twelfth doping area, having the first conductivity, disposed in the substrate, adjacent to the fourth gate structure and separated from the fourth doping well.

15. The ESD protection device according to claim 14, wherein the fourth parasitic BJT is formed between the eleventh doping area, the twelfth doping area and the substrate.

16. The ESD protection device according to claim 14, wherein the third distance is shorter than the fourth distance.

17. The ESD protection device according to claim 14, further comprises a guarding ring surrounding the first trigger element, the second trigger element, the first SCR element and the second SCR element.

18. The ESD protection device according to claim 17, wherein the first SCR element is disposed between the guarding ring and the first trigger element; and the second SCR element is disposed between the guarding ring and the second trigger element.

* * * * *